United States Patent [19]

Van Der Meer

[11] Patent Number: 4,871,329

[45] Date of Patent: Oct. 3, 1989

[54] SNAP-LOCK CONNECTION

[75] Inventor: Johannes A. Van Der Meer, Drachten, Netherlands

[73] Assignee: U.S. Philips Corporation, N.Y., N.Y.

[21] Appl. No.: 116,601

[22] Filed: Nov. 2, 1987

[30] Foreign Application Priority Data

Nov. 5, 1986 [DE] Fed. Rep. of Germany ... 8629518[U]

[51] Int. Cl.⁴ .................. H01R 13/506; H01R 13/639
[52] U.S. Cl. ..................................... 439/594; 292/80; 292/86; 411/339
[58] Field of Search ............... 439/350, 352, 357, 358, 439/594, 596, 701; 411/338, 339, 508–510; 292/19, 80, 81, 86; 70/387; 24/297, 324, 648

[56] References Cited

U.S. PATENT DOCUMENTS

| | | | |
|---|---|---|---|
| 3,133,777 | 5/1964 | Anhalt | 439/350 X |
| 3,793,610 | 2/1974 | Brishka | 439/352 X |
| 4,431,244 | 2/1984 | Anhalt et al. | 439/358 |
| 4,593,441 | 6/1986 | St. Louis | 24/297 |
| 4,708,662 | 11/1987 | Klein | 439/357 X |

Primary Examiner—Paul Gensler
Attorney, Agent, or Firm—Ernestine C. Bartlett

[57] ABSTRACT

By means of a snap-lock connection housing parts (1, 20) are detachably connected to one another. To preclude inadvertent unlatching each latching hook (5, 6) and each latching element (25, 26) is immobilized by means of a stop (15, 16; 33, 34). The latching hooks (5, 6) and latching elements (25, 26,) can be moved relative to each other from outside to bring them out of latching engagement.

22 Claims, 1 Drawing Sheet

SNAP-LOCK CONNECTION

BACKGROUND OF THE INVENTION

The invention relates to a snap-lock connection between housing parts of an electrical apparatus, comprising at least one latching hook connected to a first housing part and arranged to engage in a latching element connected to a second housing part, each latching hook and each latching element being elastically movable into and out of latching engagement, and a stop for each latching hook to preclude inadvertent disengagement.

It is known (DE-PS 3,427,936 and U.S. Pat. No. 4,653,783 which corresponds substantially thereto) to connect housing parts detachably to the housing of an electrical apparatus by means of a snap-lock connection. In order to ensure that the snap-lock connection does not deteriorate during the life of the apparatus the latching hook is urged against the latching element via a rubber buffer. The snap-lock connection can be released after removal of the rubber buffer. In the case of a handheld electrical apparatus, for example an electric shaver, the rubber buffer may render the apparatus less convenient to handle. Moreover, it may also become detached inadvertently in operation. Therefore, inadvertent disengagement cannot be excluded and a hazardous situation may arise because live electrical components are then exposed. In particular this may be so, for example when such apparatus get into the hands of children.

SUMMARY OF THE INVENTION

It is the object of the invention to construct a snap-lock connection for electrical apparatus of the said type so as to preclude an inadvertent disengagement of the snap-lock connection.

In a snap-lock connection of the type defined this object is achieved in that at a distance from each latching element a stop for a latching hook is formed on the second housing part and in that at a distance from each latching hook a further stop for a latching element is formed on the first housing part.

As both the latching hook and the latching element have an associated stop on the facing second or first housing part, respectively, an inadvertent displacement of a latching hook relative to a latching element into the disengaged position is avoided, because the movements of the latching hook and the latching element are both limited by stops. Each stop is arranged in such a way that apart from the clearance required for bringing the latching hook or the latching element into latching engagement there is substantially no room for movement. The limited movement thus precludes an inadvertent disengagement as a result of a displacement of the housing parts relative to each other, for example, when the housing parts are subjected to shocks if the apparatus falls or the like, or when it is not treated properly.

In a preferred embodiment each latching element or each latching hook is formed with a guide portion constructed to engage in a gap formed between a stop and the adjacent latching hook or latching element. Thus, the movement of each latching hook and each latching element after latching engagement is limited simply and effectively.

In another preferred embodiment facing surfaces of the latching hooks and the latching elements are formed with recesses which after latching engagement constitute externally accessible cavities via which the latching hooks and the latching elements are movable out of latching engagement. Thus, the elasticity of the latching hooks and latching elements enables the snap-lock connection to be disengaged simply. Access to the cavity can be inconspicuous, for example, if small-diameter access openings are formed in a housing wall, to avoid undesired access to the cavity, for example by children.

In the case of a suitable elasticity of the latching hook and the latching element it is merely required that for the purpose of unlatching the cross-section of a tool inserted into the cavity in the unlatching direction is slightly larger than that of the cavity.

However, it may also be advantageous that the cavity has a narrowed end portion such as, for example, a wedgeshaped portion which diverges towards an access opening. When a tool which is inserted from the exterior engages the wedgeshaped portion the latching hook and latching element can be moved simply relative to one another for the purpose of unlatching.

It is further found to be advantageous if the latching element has an opening for the passage of a portion of the latching hook. This enables the snap-lock connection to be established in a simple way.

In a very advantageous embodiment the latching hooks and latching elements with the associated guide portions extend substantially perpendicularly to the wall of the first and the second housing part respectively. This enables the snap-lock connection to be made in a simple way.

Further, it is advantageous that each latching hook with its associated stop is integral with the first housing part. This enables the first housing part together with the associated part of the snap-lock arrangement to be manufactured in a simple way. This also applies to the second housing part when each latching element with its associated stop is integral with this part.

In a further preferred embodiment each stop has a portion which is bevelled towards its adjacent latching hook or latching element to form an access opening for the gap. This enables the snap-lock connection to be made in a simple way because the access opening guides the guide portions of the latching hooks and latching elements into the corresponding gaps.

For manufacturing a reliable snap-lock connection it is very advantageous if the first housing part comprises two mutually spaced latching hooks whose portions which are engageable in the latching elements are remote from each other, and the second housing part comprises two latching elements to form two snap-lock connections.

DESCRIPTION OF THE DRAWING

An embodiment of the invention will now be described in more detail, by way of example, with reference to the accompanying drawing. In the drawing.

DETAILED DESCRIPTION OF THE PREFERRED

Figure 1:
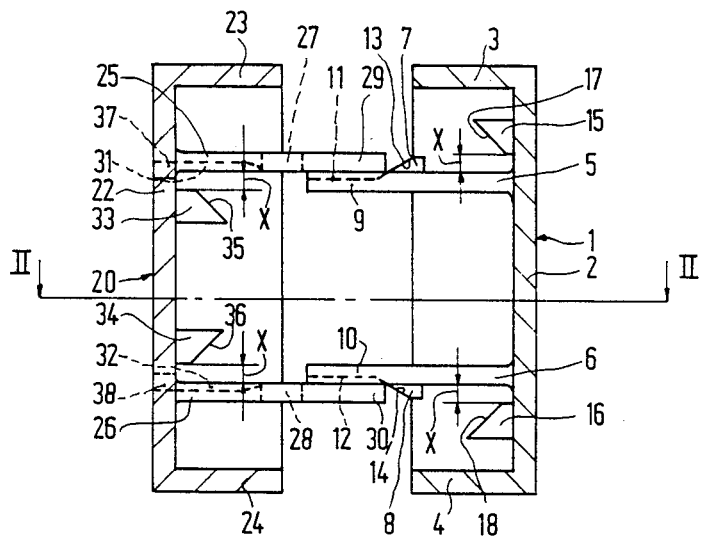
FIG. 1 is a simplified diagrammatic longitudinal sectional view of a first and a second housing part before latching.

A first housing part 1 (FIGS. 1 and 2), which is for example a part of a housing for an electric shaver, basically has the shape of one half of a hollow cylinder having a semicylindrical circumferential wall 2 and semicircular end surfaces 3 and 4 which extend perpendicularly to said wall. Elastic cantilever latching hooks 5 and 6 extend radially inwards from the wall 2 at equal distances from the end surfaces 3 and 4 respectively. Each of the two identical latching hooks 5, 6 is of rectangular cross-section and is disposed in a plane which extends substantially parallel to the end surfaces 3, 4.

Substantially in their centers the non-facing lateral surfaces of the latching hooks 5, 6 are each formed with a latching portion 7, 8 which projects towards the adjacent end surface 3 or 4. The extensions of each latching hook 5, 6 beyond the latching portions 7 and 8 respectively constitute guide portions 9, 10. The free end portion of each latching hook 5, 6 is formed with a recess 11, 12 which is open at the free end of each latching hook 5, 6 and those surfaces of the latching hooks 5, 6 which are remote from each other, which recess extends radially outwards substantially up to a latching projection 7, 8. Each recess 11, 12 terminates substantially in a facing inclined surface 13, 14 formed on the respective latching projections 7 and 8. Between each latching hook 5, 6 and the adjacent end wall 3, 4 a stop 15, 16 projects from the circumferential wall 2 at a distance x from the adjacent latching hook 5, 6. Each stop 15, 16 has a portion 17, 18 which is bevelled towards the adjacent latching hook 5, 6.

In the same way as the first housing part 1 a second housing part 20, for example for an electric shaver basically has the shape of one half of a hollow cylinder having a circumferential wall 22 and end walls 23 and 24 which extend perpendicularly thereto and which after interconnection of the two housing parts 1, 20 are disposed in one plane, which walls may be provided with connectors or openings, not shown, for shaving elements and electrical connections. At equal distances from the end walls 23, 24 elastic cantilever latching elements 25, 26 extend radially inwards. The two identical latching elements 25, 26 are of rectangular cross-section and extend in planes parallel to the end surfaces 23 and 24 and hence to the latching hooks 5, 6. Substantially in its centre each latching element 25, 26 is formed with an access opening 27, 28 which extends in an axial direction relative to the circumferential wall 22. The portion of a latching element 25, 26 which extends beyond an access opening 27, 28 is constructed as a guide portion 29, 30. The facing surfaces of the latching elements 25, 26 are formed with recesses 31 and 32 which are open to the relevant surface. The recesses 31, 32 extend up the the circumferential wall 22 and in radially inward directions they terminate substantially at the access openings 27 and 28, where they end in substantially inclined surfaces. Each latching element 25, 26 has an associated stop 33, 34 which is spaced from the facing surfaces of the latching elements 25, 26 by a distance x. Each of the stops 33, 34 extend from the circumferential wall 22 in substantially the same direction as the latching elements 25, 26 and has a portion 35 and 36 which is inclined towards the adjacent latching element 25, 26.

Figure 2:
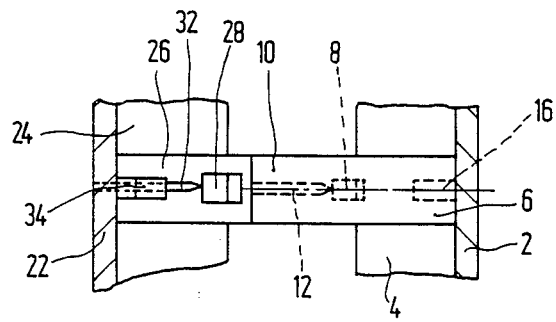
FIG. 2 is a partly sectional view taken on the line II—II in FIG. 1, and FIG. 3 diagrammatically shows a tool for unlatching.

The two housing parts 1, 20, which are shown in a position before latching in FIG. 1, are moved radially towards one another to obtain latching engagement. The two latching hooks 5, 6 are then situated between the latching elements 25, 26. As the distance between the two housing parts 1, 20 decreases the guide portions 29, 30 of the latching elements 25, 26 contact the inclined surfaces 13 and 14 of the latching portions 7 and 8 respectively, so that each latching hook 5, 6 and the associated latching element 25, 26 deflect elastically relative to each other. After latching, i.e. after the latching portions 7, 8 have engaged in the openings 27 and 28, the latching hooks 5, 6 and the latching elements 25, 26 resume their substantially nondeformed initial positions in which the latching hooks 5, 6 and the latching elements 25, 26 are disposed in substantially parallel planes. The guide portions 29, 30 then engage in a gap formed between a stop 15, 16 and the adjacent latching hook 5, 6. Engagement of the guide portions 29, 30 is facilitated by the inclined portions 17, 18. Similarly, after latching the guide portions 9 and 10 of the latching hooks 5 and 6 engage the gaps formed between each latching element 25, 26 and the adjacent stop 33, 34. Engagement is facilitated in a similar way by the inclined portions 35 and 36. The distance x is dimensioned in such a way that apart from the clearance necessary for bringing the relevant guide portions 9, 10, 29 and 30 into latching engagement these portions have no room for movement in said gaps. This precludes an inadvertent unlatching, for example as a result of relative displacements of the housing parts 1, 2 when the apparatus falls or is not treated properly. As both the latching hooks 5, 6 and the latching elements 25, 26 are immobilized, even large relative displacements between the housing parts 1, 20 cannot lead to undesired disengagement.

In the latched position the relevant recesses 11, 31 and 12, 32 are situated adjacent one another, thus forming cavities which terminate in substantially wedge-shaped portions in radially inward directions. In radially outward directions the cavities terminate in the circumferential wall 22 as access openings 37, 38 which are substantially coaxial with said cavities.

In order to unlatch the two housing parts 1, 20 when required, for example for repair or maintenance purposes, the latching hooks 5, 6 and the latching elements 25, 26 merely have to be moved away from one another via the access openings 37, 38 giving access to the cavities formed by the recesses 11, 31 and 12, 32, respectively.

Thus, in order to detach the connection a tool can be inserted into the cavities. The diameters of the access openings 37, 38 provided for this purpose can be small to preclude undesired access to the cavities, for example by children.

Figure 3:
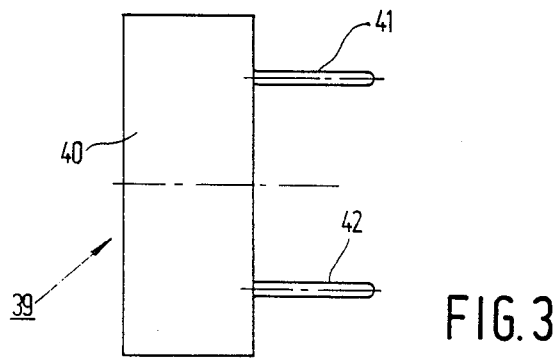

To simplify disengagement of the snap-lock connection it is possible to use, for example, a tool 39 as shown in FIG. 3. This tool has a handle 40 and two pins 41, 42 which extend substantially perpendicularly thereto. These pins are spaced from each other by the same distance as the openings 37, 38, so that via these openings they can enter the cavities formed by the respective recesses 11, 31 and 12, 32. By means of the pins 41, 42 the latching hooks 5, 6 and the latching elements 25, 26 can be moved relative to each other for the purpose of unlatching. To this end the pins 41, 42 have a cross-section which in the direction of movement for unlatching is larger than the dimension of the cavity, so that the latching portions 7, 8 can be made to disengage from the access openings 27, 28 by elastic deflection of the latching hooks 5, 6 and the latching elements 25, 26. The deflection of the latching hooks 5, 6 and the latching elements 25, 26 relative to each other can be easier as a result of the cooperation of the free ends of the pins 41, 42 with the essentially wedge-shaped end portions of the cavities.

To facilitate manufacture of the housing parts 1 and 20 to be interconnected by means of the snap-lock connection the latching hooks 5, 6 and the stops 15, 16 can be constructed integrally with the first housing part 1 from, for example, a plastic material, and similarly the latching elements 25, 26 and the stops 33, 34 can be formed integrally with the second housing part 20. To simplify manufacture of the tool 39, the pins 41 and 42 may also be integral with the handle 40.

What is claimed is:

1. A snap-lock connection between housing parts of an electrical apparatus, comprising at least one latching hook connected to a first housing part and arranged to engage in a latching element connected to a second housing part, each latching hook and each latching element being elastically movable into and out of latching engagement, wherein at a distance from each latching element a stop for a latching hook is formed on the facing second housing part and at a distance from each latching hook a further stop for the latching element is formed on the facing first housing part to preclude inadvertent disengagement, movement of each latching element and of each latching hook after latching engagement being limited by a stop associated therewith.

2. A snap-lock connection as claimed in claim 1, wherein each latching element has an opening for the passage of a portion of the latching hook.

3. A snap-lock connection as claimed in claim 1, wherein each latching hook with its associated stop is integral with the first housing part.

4. A snap-lock connection as claimed in claim 1, wherein each latching element with its associated stop is integral with the second housing part.

5. A snap-lock connection as claimed in claim 1, wherein each stop has a portion which is bevelled towards its adjacent latching hook or latching element, respectively to form an access opening for the gap.

6. A snap-lock connection as claimed in claim 1, wherein (1) the first housing part comprises two mutually spaced latching hooks having portions which are engageable in the latching elements and remote from each other, and (2) the second housing part comprises two latching elements to form two snap-lock connections.

7. A snap-lock connection as claimed in claim 1, wherein each latching element and each latching hook is formed with a guide portion constructed to engage in a gap formed between a stop and the adjacent latching hook and latching element, respectively.

8. A snap-lock connection as claimed in claim 7, wherein each latching hook and each latching element with the associated guide portion extends substantially perpendicularly to a wall of the first and the second housing part respectively.

9. A snap-lock connection between housing parts of an electrical apparatus, comprising at least one latching hook connected to a first housing part and arranged to engage in a latching element connected to a second housing part, each latching hook and each latching element being elastically movable into and out of latching engagement, wherein at a distance from each latching element a stop for a latching hook is formed on the second housing part and at a distance from each latching hook a further stop for the latching element is formed on the first housing part to preclude inadvertent disengagement, facing surfaces of the latching hooks and the latching elements being formed with recesses which after latching engagement constitute externally accessible cavities via which the latching hook and the latching elements are movable out of latching engagement.

10. A snap-lock connection as claimed in claim 9, wherein each cavity has a narrowed end portion.

11. A snap-lock connection between housing parts of an electrical apparatus, comprising at least one latching hook connected to a first housing part and arranged to engage in a latching element connected to a second housing part, each latching hook and each latching element being elastically movable into and out of latching engagement, wherein at a distance from each latching element a stop for a latching hook is formed on the second housing part and at a distance from each latching hook a further stop for the latching element is formed on the first housing part to preclude inadvertent disengagement, each latching element and each latching hook being formed with a guide portion constructed to engage in a gap formed between a stop and the adjacent latching hook and latching element, respectively; and facing surfaces of the latching hooks and the latching elements being formed with recesses which after latching engagement constitute externally accessible cavities via which the latching hooks and the latching elements are movable out of latching engagement.

12. A snap-lock connection as claimed in claim 11, wherein each cavity has a narrowed end portion.

13. A snap-lock connection between housing parts of an electrical apparatus which comprises:
    a first housing part having a wall and end surfaces which extend perpendicularly to said wall;
    at least one latching hook connected to said housing part extending from said wall at a distance from said end surfaces;
    at least one stop projecting from said wall at a distance from the adjacent latching hook;
    a second housing part having a wall and end surfaces which extend perpendicularly to said wall;
    at least one latching element extending from said wall at a distance from said end surfaces and in facing relation with said latching hook on said first housing part, and
    at least one stop projecting from said second housing part wall at a distance from the adjacent latching element,
    the frist and second housing parts being moved towards one another to obtain latching engagement of said latching hook and said latching element, movement of each latching element and each latching hook after latching engagement being limited by stops associated therewith.

14. A snap-lock connection as claimed in claim 13, wherein each latching element and each latching hook is formed with a guide portion constructed to engage in a gap formed between a stop and the adjacent latching hook and latching element, respectively.

15. A snap-lock connection as claimed in claim 13 or 14 wherein facing surfaces of the latching hooks and the latching elements are formed with recesses which after latching engagement constitute externally accessible cavities via which the latching hooks and the latching elements are movable out of latching engagement.

16. A snap-lock connection as claimed in claim 15 wherein each cavity has a narrowed end portion.

17. A snap-lock connection as claimed in claim 13 wherein each latching element has an opening for the passage of a portion of the latching hook.

18. A snap-lock connection as claimed in claim 14 wherein each latching hook and each latching element with the associated guide portion extends substantially perpendicularly to a wall of the first and the second housing part respectively.

19. A snap-lock connection as claimed in claim 13 wherein each latching hook with its associated stop is integral with the first housing part.

20. A snap-lock connection as claimed in claim 13 wherein each latching element with its associated stop is integral with the second housing part.

21. A snap-lock connection as claimed in claim 13 wherein each stop has a portion which is bevelled towards its adjacent latching hock or latching element, respectively to form an access opening for the gap.

22. A snap-lock connection as claimed in claim 13 wherein (1) the first housing part comprises two mutually spaced latching hooks having portions which are engageable in the latching elements and remote from each other, and (2) the second housing part comprises two latching elements to form two snap-lock connections.

* * * * *